United States Patent
Yang et al.

(10) Patent No.: US 10,117,346 B2
(45) Date of Patent: Oct. 30, 2018

(54) SUPPORTING STRUCTURE HAVING VARIABLE FORM AND ELECTRONIC DEVICE HAVING SUPPORTING STRUCTURE

(71) Applicant: SHENZHEN ROYOLE TECHNOLOGIES CO. LTD., Shenzhen (CN)

(72) Inventors: Songling Yang, Shenzhen (CN); Songya Chen, Shenzhen (CN); Dan Ni, Shenzhen (CN); Zihong Liu, Shenzhen (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/540,897

(22) PCT Filed: Dec. 30, 2014

(86) PCT No.: PCT/CN2014/095648
§ 371 (c)(1),
(2) Date: Jun. 29, 2017

(87) PCT Pub. No.: WO2016/106597
PCT Pub. Date: Jul. 7, 2016

(65) Prior Publication Data
US 2017/0359915 A1    Dec. 14, 2017

(51) Int. Cl.
*H05K 5/00* (2006.01)
*H05K 5/02* (2006.01)
(Continued)

(52) U.S. Cl.
CPC ........... *H05K 5/0226* (2013.01); *G06F 1/163* (2013.01); *G06F 1/1652* (2013.01); *G09F 9/00* (2013.01);
(Continued)

(58) Field of Classification Search
None
See application file for complete search history.

(56) References Cited

U.S. PATENT DOCUMENTS 9,733,668 B2 * 8/2017 Park ................. G06F 1/163
10,019,036 B2 * 7/2018 Sun ................. G06F 3/041
(Continued)

FOREIGN PATENT DOCUMENTS

CN    101952873 A    1/2011
CN    103985315 A    8/2014
(Continued)

*Primary Examiner* — Courtney Smith
*Assistant Examiner* — Rashen E Morrison
(74) *Attorney, Agent, or Firm* — Hauptman Ham, LLP

(57) ABSTRACT

Disclosed are a supporting structure having a variable form and an electronic device having the same. A supporting structure may include a fixing module, a tail end module, and a flexible module connecting the fixing module and the tail end module. The flexible module may include multiple chain units. The chain unit may include a support plate having a support surface and a lower surface opposite to the support surface, and a driving portion extending along from a side of the support plate away from the lower surface of the support plate. The chain units are hingedly connected in series. Adjacent chain units may drive the support surfaces to construct different forms through interaction between the driving portions, thereby forming the supporting structure whose form can be flexibly changed.

20 Claims, 5 Drawing Sheets

(51) Int. Cl.
*G09F 9/00* (2006.01)
*H01F 7/02* (2006.01)
*G06F 1/16* (2006.01)

(52) U.S. Cl.
CPC ......... *H01F 7/0231* (2013.01); *H05K 5/0017* (2013.01); *H05K 5/0086* (2013.01); *H05K 5/0217* (2013.01)

(56) References Cited

U.S. PATENT DOCUMENTS

| | | | |
|---|---|---|---|
| 10,029,617 B2 * | 7/2018 | Klausmann | B60R 5/047 |
| 2011/0043976 A1 * | 2/2011 | Visser | G09F 9/00 361/679.01 |
| 2014/0160055 A1 * | 6/2014 | Margolis | G06F 1/163 345/174 |
| 2015/0089974 A1 * | 4/2015 | Seo | A44C 5/0076 63/1.13 |

FOREIGN PATENT DOCUMENTS

| | | |
|---|---|---|
| CN | 104137168 A | 11/2014 |
| EP | 2728434 A1 | 5/2014 |
| KR | 101441081 B1 | 9/2014 |

* cited by examiner

SUPPORTING STRUCTURE HAVING VARIABLE FORM AND ELECTRONIC DEVICE HAVING SUPPORTING STRUCTURE

TECHNICAL FIELD

The present disclosure relates to supporting structures, and more particularly relates to a supporting structure having a variable form, and an electronic device incorporating a flexible display screen applied with the supporting structure having a variable form.

BACKGROUND

Currently, electronic devices equipped with display function are limited to a panel structure based on the rigid display nature of display screens, so the space for improvement is very limited in terms of product's portable design and display effects.

The advantages of flexible display become increasingly prominent with the development of display technology. Studies of applications of the flexible display to an electronic device are on the rise due to the advantages of thinness, flexibility, and portability of the flexible display, making the flexible display become an important direction of development of the current display technology.

The concept of "wearable equipment" gradually becomes a hot direction of product design, but how to mount flexible display screens to give full play to thinness and flexibility features of the flexible display screens is a major problem in terms of product design. In the related art, the flexible display screens already have been applied to foldable electronic devices, but it is limited to only a fixed bending portion and a fixed bending angle, which fails to make sufficient use of the form plasticity of the flexible display screens.

In view of the above, the present disclosure provides a supporting structure having a variable form and an electronic device having the same, so as to give full play to the form plasticity of the flexible display screens.

SUMMARY

It is an object of the present disclosure to provide a supporting structure having a variable form and an electronic device having the same. Different forms of support surfaces that are hingedly connected in succession are constructed through interaction between driving portions of adjacent chain units, thereby forming a supporting structure whose form can be flexibly changed.

The present disclosure provides a supporting structure having a variable form. The supporting structure may include a fixing module, a tail end module, and a flexible module connecting the fixing module and the tail end module. The flexible module may include multiple chain units. The chain unit may include a support plate having a support surface and a lower surface opposite to the support surface, and a driving portion extending from a side of the support plate away from toward the lower surface. The chain units may be hingedly connected in series. The adjacent chain units may drive the support surfaces through interaction between the driving portions to change a form of the flexible module.

The present disclosure further provides an electronic device. The electronic device may include any one of the above supporting structures, and a flexible display screen. The flexible display screen may be arranged on the supporting structure.

The supporting structure provided by the present disclosure may include the fixing module, the tail end module, and the flexible module connecting the fixing module and the tail end module. Different forms of the support surfaces that are hingedly connected in succession are constructed through the interaction between the driving portions of the adjacent chain units, thereby forming the supporting structure whose form can be flexibly changed.

BRIEF DESCRIPTION OF THE ACCOMPANYING DRAWINGS

DETAILED DESCRIPTION OF ILLUSTRATED EMBODIMENTS

The present disclosure will now be described in further detail with reference to the accompanying drawings and embodiments, in which the objects, solutions, and advantages of the present disclosure will become more apparent. It is to be understood that specific embodiments described herein are merely illustrative of the present disclosure and are not intended to limit the present disclosure.

Throughout the following preferred embodiments, the same reference signs are used to designate the same parts.

Figure 1:
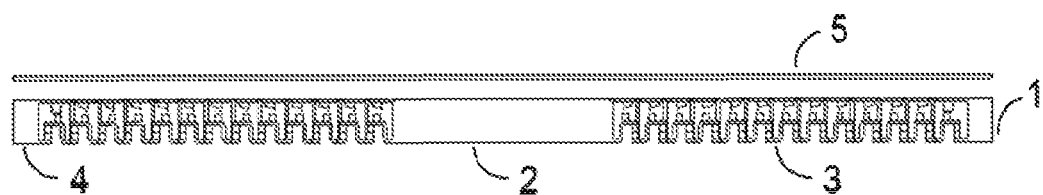
FIG. 1 is a structural view illustrating an electronic device according to an embodiment of the present disclosure.
Figure 2:
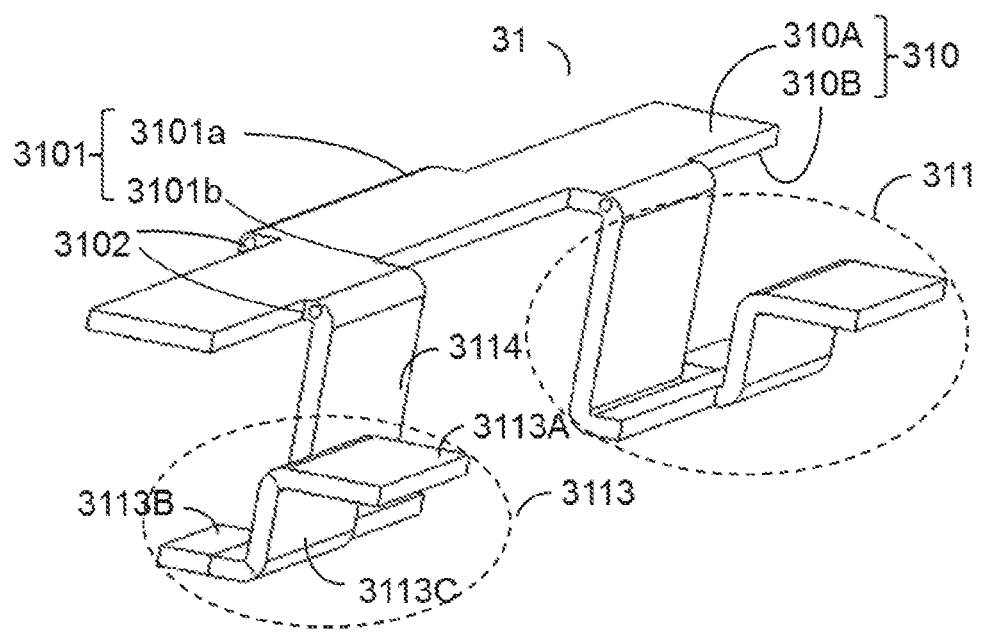
FIG. 2 is a structural view illustrating a chain unit according to an embodiment of the present disclosure.

FIG. 1 is a structural view illustrating an electronic device provided by an embodiment of the present disclosure. The electronic device may include a flexible display screen 5, and a supporting structure 1. The supporting structure 1 may include a fixing module 2, a tail end module 4, and a flexible module 3 connecting the fixing module 2 and the tail end module 4. The flexible module 3 may include multiple chain units 31. As illustrated in FIG. 2, the chain unit 31 may include a support plate 310 having a support surface 310A and a lower surface 310B opposite to the support surface 310A, and a driving portion 311 extending from a side of the support plate 310 away from the lower surface 310B of the support plate 310. The chain units 31 may be hingedly connected in succession through connecting portions 3101 arranged on opposite sides of the support plates 310. The adjacent chain units 31 may drive the support surfaces 310A through interaction between the driving portions 311 to change a form of the flexible module 3. The flexible display screen 5 may be arranged on the supporting structure 1.

The flexible display screen 5 may be affixed to the supporting structure 1 after encapsulation.

Figure 3:
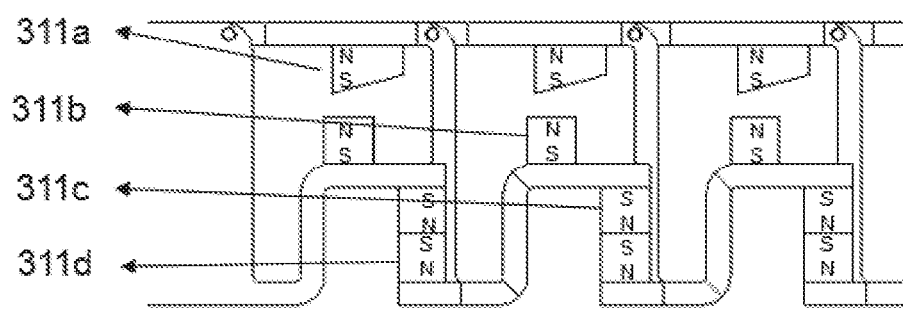
FIG. 3 is a structural view illustrating a flexible module in an flattened state according to an embodiment of the present disclosure.
Figure 4:
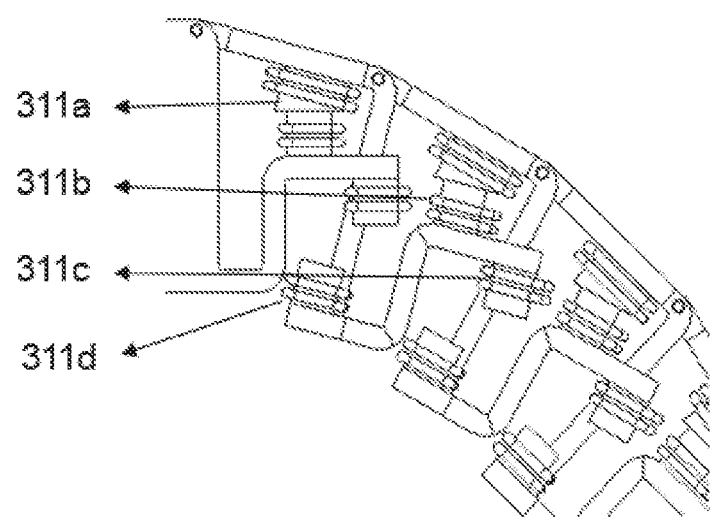
FIG. 4 is a structural view illustrating a flexible module in a bent state according to an embodiment of the present disclosure.

A first embodiment of the present disclosure provides a supporting structure having a variable form. As illustrated in FIG. 3 and FIG. 4, the chain unit 31 may further include a first magnet 311a arranged on the lower surface 310B of the support plate 310 opposite to the support surface 310A, and a second magnet 311b, a third magnet 311c, and a fourth magnet 311d arranged on the driving portion 311. The operation that the adjacent chain units 31 change the form of the flexible module 3 through the interaction between the driving portions 311 may include the follows. When an attractive force is generated between the second magnet 311b and the first magnet 311a of the adjacent chain unit, two support surfaces 310A of the adjacent chain units 31 may form a bent form as illustrated in FIG. 4. When an attractive force is generated between the third magnet 311c and the fourth magnet 311d of the adjacent chain unit, the two support surfaces 310A of the adjacent chain units 31 may form a flattened form as illustrated in FIG. 3.

Referring to FIGS. 2 to 4, in the embodiment, the driving portion 311 may include an actuating portion 3113, and a joint portion 3114 connecting the actuating portion 3113 and the support plate 310. The actuating portion 3113 may include a first bearing plate 3113A carrying the second magnet 311b and the third magnet 311c, a second bearing plate 3113B carrying the fourth magnet 311d, and a connecting portion 3113C connecting the joint portion 3114, the first bearing plate 3113A, and the second bearing plate 3113B. The first magnet 311a may be arranged on the lower surface 310B of the support plate 310, the fourth magnet 311d may be arranged on a upper surface of the second bearing plate 3113B (i.e., the surface facing the support plate 310). The second magnet 311b may be arranged on a upper surface of the first bearing plate 3113A (i.e., the surface facing the support plate 310) at a position where the second magnet 311b and the first magnet 311a of the adjacent chain unit can be attracted to each other. The third magnet 311c may be arranged on a lower surface of the first bearing plate 3113A (i.e., the surface facing away from the support plate 310) at a position where the third magnet 311c and the fourth magnet 311d of the adjacent chain unit can be attracted to each other.

Preferably, the joint portion 3114 may extend from a second connecting portion 3101b arranged at a side of the support plate 310 toward a side where the lower surface 310B is located, and further may be joined to the connecting portion 3113C.

The connecting portions 3101 arranged at the opposite sides of the support plate 310 may extend along the support surface 310A, and may define shaft holes 3102. An extending region of the second side connecting portion 3101b can be engaged with that of a first side connecting portion 3101a, so that the second side connecting portion 3101b can be hingedly connected to the first side connecting portion 3101a of the adjacent chain unit by passing a hinge pin 3103 through the shaft holes 3102 of the extending regions, as illustrated in FIG. 5.

Figure 5:
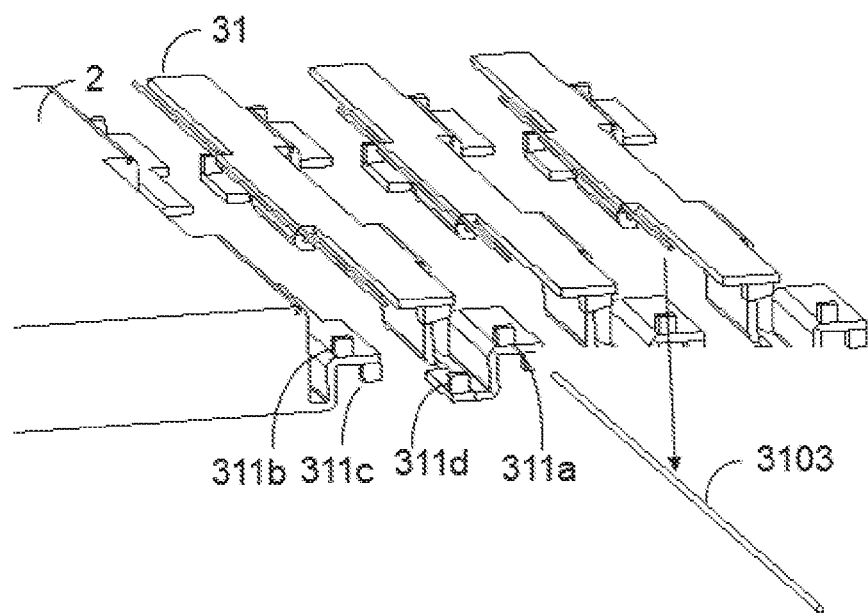
FIG. 5 is an exploded structural view illustrating a fixing module and a flexible module according to an embodiment of the present disclosure.

Opposite sides of the fixing module 2 may respectively include first side connecting portions or second side connecting portions which can be hingedly connected to the chain units 31, as illustrated in FIG. 5. That is, what is needed for the fixing module 2, is the connecting portion that can be engaged with the chain units 31. For example, when the chain unit 31 of the flexible module 3 is connected to the fixing module 2 via the first side connecting portion 3101a, the second side connecting portion 3101b is arranged at a side of the fixing module 2 connected to the chain unit for a hinged connection. The fixing module 2 may further include a portion of the driving portion 311 used for engaging with the chain unit 31. As illustrated in FIG. 5, the portion of the driving portion 311 may include the second magnet 311b engageable with the first magnet 311a arranged at the hinge side of the chain unit 31, and the third magnet 311c engageable with the fourth magnet 311d of the chain unit 31.

Figure 6:
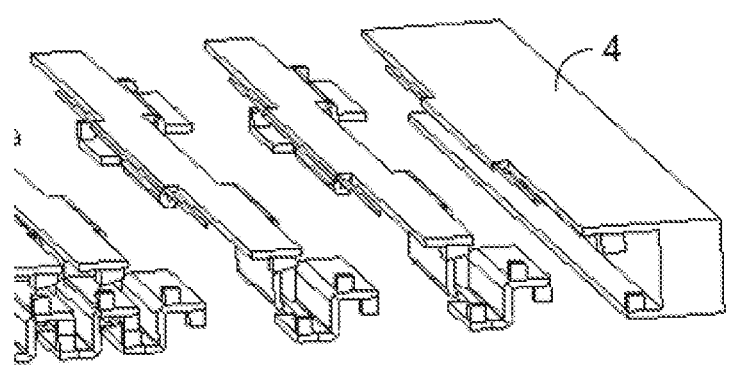
FIG. 6 is an exploded structural view illustrating a tail end module and a flexible module according to an embodiment of the present disclosure.
Figure 7A:
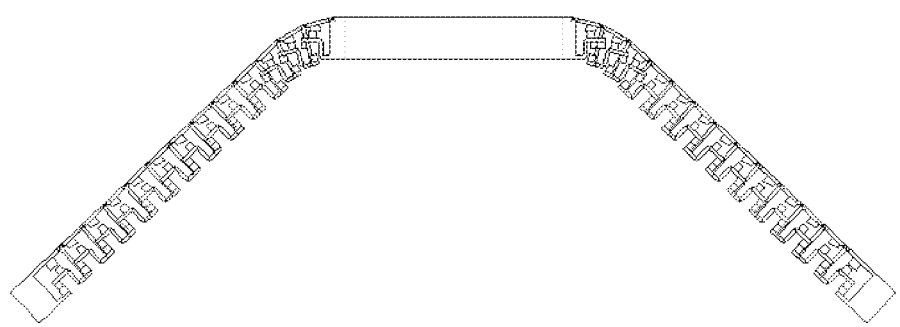
FIGS. 7a to 7d are structural views of supporting structures having different forms according to embodiments of the present disclosure.
Figure 7B:
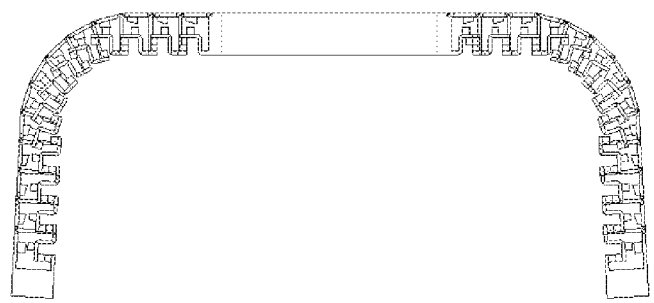
Figure 7C:
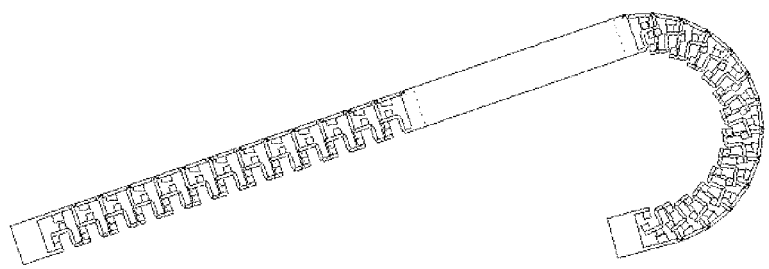
Figure 7D:
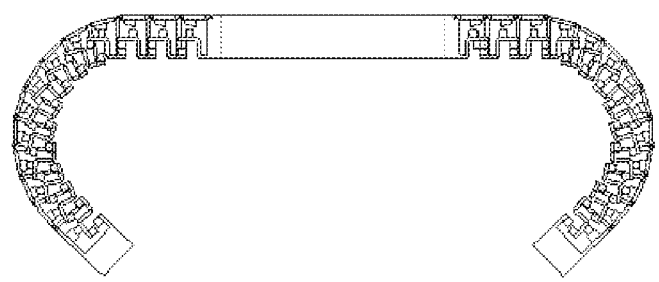

An inner side of the tail end module may include a first side connecting portion or a second side connecting portion which can be hingedly connected to the chain unit, as illustrated in FIG. 6, the principle is the same as that described above, which will not be repeated herein.

In the preferred embodiment, the joint portion 3114 vertically extends from the second connecting portion 3101b, and the second bearing plate 3113B is vertically jointed to the actuating portion 3113. The actuating portion 3113 may be of a right angled Z shape, that is, the first bearing plate 3113A and the second bearing plate 3113B may be respectively perpendicular to the connecting portion 3113C, and respectively extend horizontally toward two sides away from a plane of the connecting portion 3113C. When the third magnet 311c and the fourth magnet 311d of the adjacent chain unit are attracted to each other under an external force, the first bearing plate 3113A and the second bearing plate 3113B of the adjacent chain unit are attracted to each other to be parallel to each other, causing the two support surfaces lie in the same plane to form a flattened form. When the second magnet 311b and the first magnet 311a of the adjacent chain unit are attracted to each other under an external force, the support surface of the adjacent chain unit may be rotated about the hinge pin hingedly connected to the first side connecting portion until the second magnet 311b fits with the first magnet 311a, so that an angle is defined between the adjacent support surfaces to cause the chain units 31 to be in a bent state. Thus, under an external force, the supporting structure 1 can change different forms of the flexible module 3, as illustrated in FIG. 7a, FIG. 7b, FIG. 7c, and FIG. 7d, but the present disclosure is not limited thereto. That is, the flexible module 3 can be presented in any form by changing the attraction state between the chain units 31.

It can be understood that the magnets of the present disclosure may include but are not limited to permanent magnets, electromagnets, or a combination thereof. Referring to FIG. 3, it can be appreciated by those skilled in the art that when the magnets are the permanent magnets, the third magnet 311c (N pole) and the fourth magnet (S pole) of the adjacent chain unit are attracted to each other, the second magnet 311b (N pole) is separated from the first magnet (S pole) of the adjacent chain unit, thus the two support surfaces 310A remain in the flattened state. While under an external force, when the second magnet 311b (N pole) and the first magnet (S pole) of the adjacent chain unit are attracted to each other, the third magnet 311c (N pole) is separated from the fourth magnet 311d (S pole) of the adjacent chain unit, thus the two support surfaces 310A form an angle relative to each other to be changed into the bent state. Also, the attraction of the magnets enables the state of the flexible module to remain unchanged. When the magnets are the electromagnets, the external force may be a control signal generated by a connecting circuit, which may control the attraction between the first magnet 311a and the second magnet 311b of the adjacent chain unit 31 or between the third magnet 311c and the fourth magnet 311d of the adjacent chain unit 31. Referring to FIG. 4, when the second magnet 311b and the first magnet of the adjacent chain unit are electrically disconnected, and the third magnet 311c and the fourth magnet of the adjacent chain unit are electrically connected, the third magnet 311c and the fourth magnet of the adjacent chain unit are attracted to each other, the two support surfaces remain in the flattened state. When the second magnet 311b and the first magnet of the adjacent chain unit are electrically connected, and the third magnet 311c and the fourth magnet of the adjacent chain unit are electrically disconnected, the second magnet 311b and the first magnet of the adjacent chain unit are attracted to each other, the two support surfaces form an angle relative to each other to be changed into the bent state.

Figure 8:
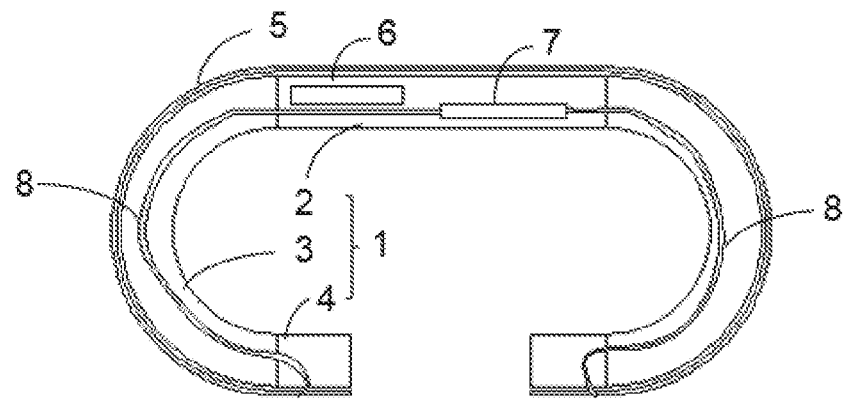
FIG. 8 is a structural view illustrating an electronic device according to another embodiment of the present disclosure.

Referring to FIG. 8, in the embodiment, the fixing module 2 and the tail end module 4 can be used to accommodate various desired components or parts, including electronic components, such as a battery 6 for supplying power to the electronic device, and a printed circuit board (PCB) 7. Furthermore, a flexible printed circuit (FPC) 8 can be electrically connected to the components in the fixing module 2 and the tail end module 4, and electrical connection interfaces of the flexible display screen 5 via the flexible module 3.

In the present disclosure, an electronic device can be constructed by the supporting structure 1 having a variable form and a flexible display screen. The electronic device may be a wristband-type mobile phone, but the present disclosure is not limited thereto.

Figure 9:
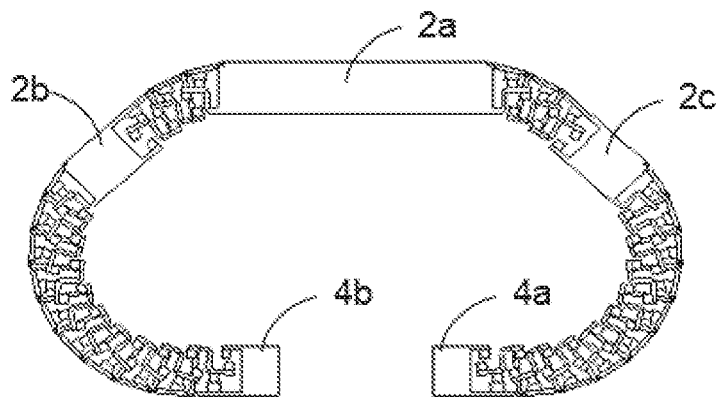
FIG. 9 is a structural view illustrating a supporting structure having a variable form according to a further embodiment of the present disclosure.

Furthermore, as illustrated in FIG. 9, the supporting structure 1 may include multiple fixing modules 2 respectively connected by the flexible module 3, that is, the components can be arranged in the fixing modules 2 as necessary, and the related components can be connected by the FPC. For example, a fixing module 2a may be used to accommodate the PCB, a fixing module 2b may be used to accommodate the battery, a fixing module 2c may be used to accommodate a camera, sensor, etc., and a tail end module 4a may be used to accommodate a headphone, and a tail end module 4h may be used to accommodate a microphone. That is, for the electronic device provided by the present disclosure, the number, size, combination mode, arrangement positions of the components, and the like of the fixing module 2 and the flexible module 3 can be selected according to layout requirements to satisfy different customer requirements.

For the supporting structure 1 having a variable form provided by the above embodiments of the present disclosure, the flexible module 3 formed by the hingedly connected chain units 31 is connected between the fixing module 2 and the tail end module 4, and the form of the flexible module 3 is changed through the driving portions 311 of the chain units 31, thus the supporting structure 1 having a variable form is constructed. In the above preferable embodiments, the flexible module 3 is connected by hinges, and the hinge pins are connected at a position above the supporting structure, that is, the support surfaces are connected at a position above the supporting structure. Therefore, when the chain units 31 are moved relative to each other, an area of the support surfaces 310A of all of the chain units 31 remains almost unchanged, thus it can be ensured that the length of the flexible display screen 5 on the supporting structure 1 remains unchanged when the flexible module 3 is either in an unfolded state or in the bent state.

The foregoing description merely depicts some preferred embodiments of the present disclosure, which are not intended to limit the present disclosure. Any modifications, equivalent substitutions, and improvements made without departing from the spirits and principles of the present disclosure shall all be encompassed within the protection of the present disclosure.

What is claimed is:

1. A supporting structure having a variable form, comprising:
at least two flexible modules; and
at least one fixing module, each of the at least one fixing module is operable to accommodate electronic components of an electronic device having the support structure and arranged between two of the at least two flexible modules;
wherein each of the at least two flexible modules comprises a plurality of chain units, each chain unit comprises a support plate having a support surface and a lower surface opposite to the support surface, and a driving portion extending from a side of the support plate away from the lower surface of the support plate, the chain units are hingedly connected in succession, and adjacent chain units drive the support surfaces to be bent through interaction between the driving portion and the lower surface of each two adjacent chain units, a bent of the support surfaces of the adjacent chain units changes a form of the flexible module.

2. The supporting structure of claim 1, wherein the chain unit further comprises a first magnet arranged on the lower surface of the support plate, a second magnet, a third magnet, and a fourth magnet wherein the second magnet, the third magnet, and the fourth magnet are all arranged on the driving portion;
when an attraction force is generated between the second magnet and the first magnet of the adjacent chain unit, the two support surfaces of the adjacent chain units form a bent form; and
when an attraction force is generated between the third magnet and the fourth magnet of the adjacent chain units, the two support surfaces of the adjacent chain units form a flattened form.

3. The supporting structure of claim 2, wherein the driving portion comprises an actuating portion and a joint portion connecting the actuating portion and the support plate, the actuating portion comprises a first bearing plate carrying the second magnet and the third magnet, a second bearing plate carrying the fourth magnet, and a connecting portion connecting the first bearing plate and the second bearing plate, the second magnet is arranged on a top surface of the first bearing plate and the third magnet is arranged on a lower surface of the first bearing plate.

4. The supporting structure of claim 3, wherein the joint portion extends from a side of the support plate away from the lower surface, and is joined to the connecting portion.

5. The supporting structure of claim 1, wherein a first side connecting portion and a second side connecting portion are formed at two opposite sides of the support plate, respectively, the first side connecting portion of the chain unit is hinged with the second side connecting portion of an adjacent chain unit, by passing a hinge pin through shaft holes defined in the first side connecting portion of the chain unit and the second side connecting portion of the adjacent chain unit.

6. The supporting structure of claim 1, wherein opposite sides of the fixing module respectively comprise first side connecting portions or second side connecting portions that are hingedly connectable to the chain units.

7. The supporting structure of claim 1, further comprising a tail end module operable to accommodate electronic components of the electronic device, wherein an inner side of the tail end module comprises a first side connecting portion or a second side connecting portion that is hingedly connectable to the chain unit.

8. An electronic device comprising:
a supporting structure comprising:
at least two flexible modules; and
at least one fixing module, each of the at least one fixing module is operable to accommodate electronic components of the electronic device and arranged between two of the at least two flexible modules;
wherein each of the at least two flexible modules comprises a plurality of chain units, each chain unit comprises a support plate having a support surface and a lower surface opposite to the support surface, and a driving portion extending from a side of the support plate away from the lower surface of the support plate, the chain units are hingedly connected in succession, and adjacent chain units drive the support surfaces to be bent through interaction between the driving portion and the lower surface of each two adjacent chain units, a bent of the support surfaces of the adjacent chain units changes to change a form of the flexible module; and
a flexible display screen arranged on the supporting structure.

9. The electronic device of claim 8, wherein the chain unit further comprises a first magnet arranged on the lower surface of the support plate, a second magnet, a third magnet, and a fourth magnet wherein the second magnet, the third magnet, and the fourth magnet are all arranged on the driving portion;
when an attraction force is generated between the second magnet and the first magnet of the adjacent chain unit, the two support surfaces of the adjacent chain units form a bent form; and
when an attraction force is generated between the third magnet and the fourth magnet of the adjacent chain units, the two support surfaces of the adjacent chain units form a flattened form.

10. The electronic device of claim 9, wherein the driving portion comprises an actuating portion and a joint portion connecting the actuating portion and the support plate, the actuating portion comprises a first bearing plate carrying the second magnet and the third magnet, a second bearing plate carrying the fourth magnet, and a connecting portion connecting the first bearing plate and the second bearing plate, the second magnet is arranged on a top surface of the first bearing plate and the third magnet is arranged on a lower surface of the first bearing plate.

11. The electronic device of claim 10, wherein the joint portion extends from a side of the support plate away from the lower surface, and is joined to the connecting portion.

12. The electronic device of claim 10, wherein a first side connecting portion and a second side connecting portion are formed at two opposite sides of the support plate, respectively, the first side connecting portion of the chain unit is hinged with the second side connecting portion of an adjacent chain unit, by passing a hinge pin through shaft holes defined in the first side connecting portion of the chain unit and the second side connecting portion of the adjacent chain unit.

13. The electronic device of claim 10, wherein opposite sides of the fixing module respectively comprise first side connecting portions or second side connecting portions that are hingedly connectable to the chain units.

14. The electronic device of claim 10, further comprising a tail end module operable to accommodate electronic components of the electronic device, wherein an inner side of the tail end module comprises a first side connecting portion or a second side connecting portion that is hingedly connectable to the chain unit.

15. A supporting structure having a variable form, comprising:
a fixing module operable to accommodate electronic components of an electronic device having the support structure; and
a flexible module connected to the fixing module;
wherein, the flexible module comprises a plurality of chain units, each chain unit of the plurality of chain units comprises a support plate having a support surface and a lower surface opposite to the support surface, and a driving portion extending from a side of the support plate away from the lower surface of the support plate, the chain units are hingedly connected in succession;
each chain unit of the plurality of chain units further comprises a first magnet arranged on the support plate, and a second magnet, a third magnet, and a fourth magnet arranged on the driving portion; when an attraction force is generated between the second magnet and the first magnet of the adjacent chain unit, the two support surfaces of the adjacent chain units form a bent form; and when an attraction force is generated between the third magnet and the fourth magnet of the adjacent chain units, the two support surfaces of the adjacent chain units form a flattened form;
the driving portion comprises an actuating portion and a joint portion connecting the actuating portion and the support plate, the actuating portion comprises a first bearing plate carrying the second magnet and the third magnet, a second bearing plate carrying the fourth magnet, and a connecting portion connecting the first bearing plate and the second bearing plate.

16. The supporting structure of claim 15, wherein the joint portion extends from a side of the support plate away from the lower surface, and is joined to the connecting portion.

17. The supporting structure of claim 15, wherein a first side connecting portion and a second side connecting portion are formed at two opposite sides of the support plate, respectively, the first side connecting portion of the chain unit is hinged with the second side connecting portion of an adjacent chain unit, by passing a hinge pin through shaft holes defined in the first side connecting portion of the chain unit and the second side connecting portion of the adjacent chain unit.

18. The supporting structure of claim 15, further comprising a second flexible module, wherein the flexible module and the second flexible module have the same structure, and the fixing module is arranged between the flexible module and the second flexible module.

19. The supporting structure of claim 15, further comprising a second fixing module, wherein the fixing module and the second fixing module have the same structure, and the fixing module and the second fixing module are connected by the flexible module.

20. The supporting structure of claim 15, further comprising a tail end module operable to accommodate electronic components of the electronic device, wherein an inner side of the tail end module comprises a first side connecting portion or a second side connecting portion that is hingedly connectable to the chain unit.

* * * * *